US007630875B2

(12) United States Patent
King et al.

(10) Patent No.: US 7,630,875 B2
(45) Date of Patent: Dec. 8, 2009

(54) AUTOMATIC TIME WARP FOR ELECTRONIC SYSTEM SIMULATION

(75) Inventors: Edward C. King, Pleasanton, CA (US); Alan G. Smith, Livermore, CA (US); Jeffrey S. Hammond, Pleasanton, CA (US); Richard S. Czyzewski, Livermore, CA (US)

(73) Assignee: CPU Technology, Inc., Pleasanton, CA (US)

( * ) Notice: Subject to any disclaimer, the term of this patent is extended or adjusted under 35 U.S.C. 154(b) by 616 days.

(21) Appl. No.: 11/160,430

(22) Filed: Jun. 23, 2005

(65) Prior Publication Data

US 2007/0010982 A1    Jan. 11, 2007

(51) Int. Cl.
*G06F 17/50* (2006.01)
(52) U.S. Cl. .......................................... 703/14; 703/17
(58) Field of Classification Search .................. 703/14, 703/17
See application file for complete search history.

(56) References Cited

U.S. PATENT DOCUMENTS

| 5,696,942 | A | * | 12/1997 | Palnitkar et al. ............... 703/17 |
| 6,108,309 | A | * | 8/2000 | Cohoe et al. ................. 370/241 |
| 6,430,542 | B1 | * | 8/2002 | Moran ....................... 705/36 R |
| 7,343,590 | B2 | * | 3/2008 | Tormey et al. ............... 717/131 |
| 2003/0093254 | A1 | * | 5/2003 | Frankel et al. ................. 703/13 |

OTHER PUBLICATIONS

Charlie Burns, "An Architecture for a Verilog Hardware Accelerator", 1996, Proceedings of the IEEE International Verilog HDL Conference, pp. 2-11.*
iThomas J. Schriber et al., "Inside discrete-event simulation software: how it works and why it matters", 2001, Proceedings of the 2001 Winter Simulation Conference, pp. 158-168.*
Tom Laramee, "Tutorial on event driven simulations of network protocols", 1995, downloaded from the Internet Archive Wayback Machine for http://www.winslam.com/laramee/sim/index.html for May 2004, pp. 1-4.*
Peter M. Maurer, "Chapter 3 Event Driven Simulation", Jun. 13, 2004, downloaded from the Internet Archive Wayback Machine for http://cs.ecs.baylor.edu/~maurer/ , pp. 1-21.*
Gerd Meister, "A Survey on Parallel Logic Simulation", 1993, University of Saarland, pp. 1-45.*

* cited by examiner

*Primary Examiner*—Paul L Rodriguez
*Assistant Examiner*—Russ Guill
(74) *Attorney, Agent, or Firm*—Aka Chan LLP

(57) ABSTRACT

A simulation of an electronics system which performs a set of operations of interest. A simulated supervisory circuit detects a state in which all the operations have been completed, and also determines the amount of time until the occurrence of the next relevant event. Simulation time is then advanced by that amount of time. This enables simulation time corresponding to an inactive system to be eliminated.

16 Claims, 4 Drawing Sheets

AUTOMATIC TIME WARP FOR ELECTRONIC SYSTEM SIMULATION

BACKGROUND OF THE INVENTION

The present invention is related to the simulation of electronic systems and, in particular, to techniques for the efficient simulation of electronic systems.

With the increase in size and complexity of electronic systems, such as in the fields of computer processing and telecommunications, it is often impractical to build a physical prototype of the system before it is manufactured. Instead, a prototype design is often simulated by a computer for design verification and testing. This saves time and lowers costs. Nonetheless, large amounts of valuable computing time and computational power are often required for the simulation of complex systems.

In some simulations the system can go into an "idle" state where no meaningful operations are performed by the simulated system. Heretofore, the simulations have remained in an idle state until the occurrence of an event which engaged system operations once again. In the meantime, the simulations ground on to occupy the valuable time of the simulating computer with nothing of interest to show to the simulator. For example, depending upon the particular simulated system, idle states of a few milliseconds at each occurrence can stretch the simulation time to more than an hour where meaningful operations occur in only a fraction of this time. Ultimately this increases the time-to-market of the simulated system and its cost. It is useful, then, if a simulation can be accelerated by removing the "dead time" of idle states so that only meaningful operations are performed by the simulated system without adversely affecting the simulation itself. Computing time is reduced and computational power is directed toward meaningful operations, rather than sitting idly by. As a result, the simulated electronic system can be constructed much more quickly and at lower cost.

The present invention allows the acceleration of simulations by advancing the simulated system, "time warping" the simulation, through idle states to the next relevant system events.

SUMMARY OF THE INVENTION

The present invention provides for a method of simulating an electronic system which has the steps of determining when a state of the simulated electronic system is idle; determining the occurrence of a next relevant system event in the simulated electronic system when the simulated electronic system state is determined to be idle; advancing a simulation time immediately prior to the occurrence of the next relevant system event; and calculating a state of the simulated electronic system at the advanced simulation clock time so that the state of the simulated electronic system is advanced. This time-warping permits the actual time for simulating the electronic system to be reduced.

Otherwise, the simulation proceeds by ordinary simulation time step intervals. To avoid simply time-warping forward from idle state to idle state, the method further comprises preventing time-warping for a predetermined amount of time after the simulated electronic system has been previously time-warped, even if the system is in an idle state.

The present invention also provides for a computer program product for efficiently simulating an electronic system. The computer program product has code that determines when a state of the simulated electronic system is idle; code that determines the occurrence of a next relevant system event in the simulated electronic system when the simulated electronic system is determined to be idle; code that advances a simulation time immediately prior to the occurrence of the next relevant system event; code that calculates a state of the simulated electronic system at the advanced simulation time so that the state of the simulated electronic system is advanced whereby actual time for simulating the electronic system is reduced; and a computer-readable storage medium that stores the codes.

DESCRIPTION OF SPECIFIC EMBODIMENTS

An "idle" state in an electronic system does not mean that nothing necessarily is going on in the system, but rather that the system is not performing operations which are of interest to the simulator. For example, in a simulated processor system, there are times when the processor has completed all of its tasks and is waiting in an idle state. However, an examination at a more detailed level of the processor reveals the ongoing performance of many micro-operations, such as changes in internal processor states and bus cycles. Hence it is the simulator who determines what is an idle state.

With this understanding, the present invention is directed toward the avoidance of unnecessary simulation of idle states during which active operations which are of interest to the simulator are lacking. Simulations of electronic systems are accelerated by detecting when the simulated system is in an idle state and then advancing the simulation time forward to the occurrence of the next relevant system event. Such time warping is appropriate in systems which must perform a set of tasks cyclically. The tasks are completed within a specific period of time and then the process is repeated continually. In such systems, if the tasks are completed before the end of the time period, the system waits until the next time period starts. During this idle time, no useful work is being performed by the system, yet a traditional simulation nonetheless simulates the entire system during this time.

Figure 1:
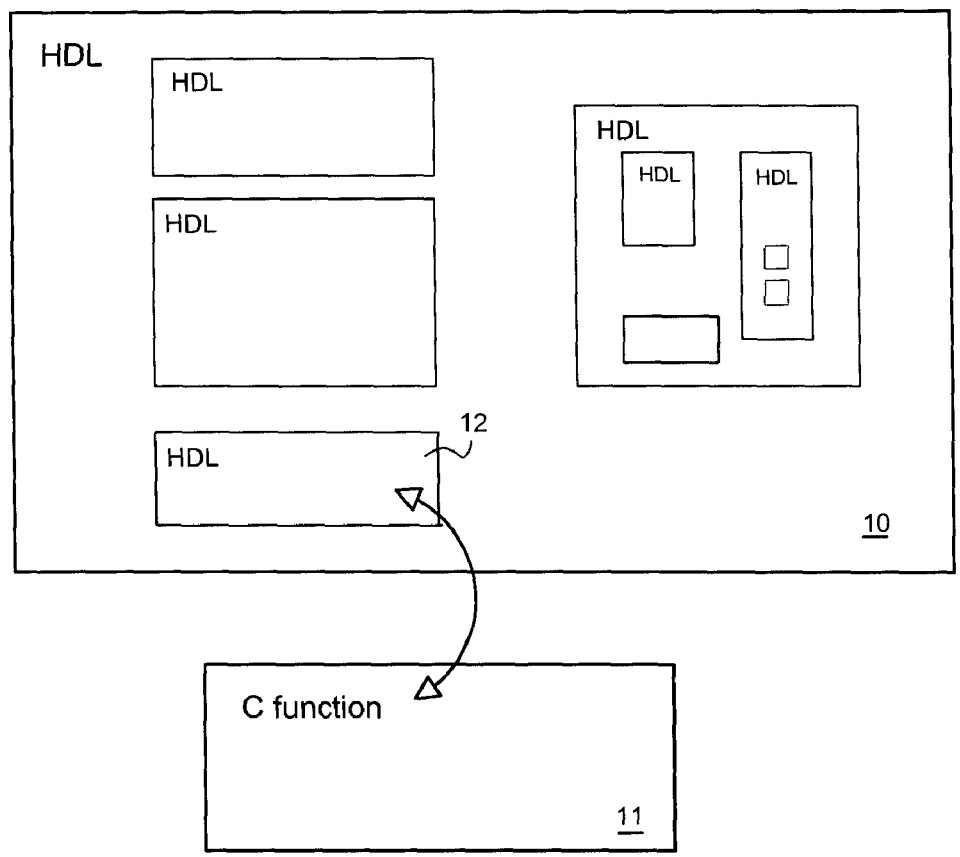
FIG. 1 is a representation of a simulated supervisory circuit and electronic system, according to one embodiment of the present invention.

Conceptually, the present invention adds a supervisory circuit 11 that operates in parallel with the simulated system 10, as illustrated in FIG. 1. The circuit inspects a subset 12 of the system functions to determine whether the state of the system meets the criteria for being "idle" in which the system remains until an event occurs. This circuit determines the occurrence of cyclic events that will take the system out of the idle state. Thus the simulated electronic system can be advanced in time instantaneously, i.e., time warping, to the point of the nearest event with the system still in the idle state at which point the simulation is then continued. The amount of real time normally spent simulating to reach that point is skipped—resulting in faster overall simulation of the system.

The amount of simulation speedup is directly related to the amount of time the system would have spent in the idle state.

Typically, simulations of electronic systems are implemented in HDL (Hardware Description Language) or one of its variants. The supervisory circuit can be implemented in several ways. In the particular embodiment described below, a combination of HDL statements and a behavioral model written in C is used.

Figure 3A:
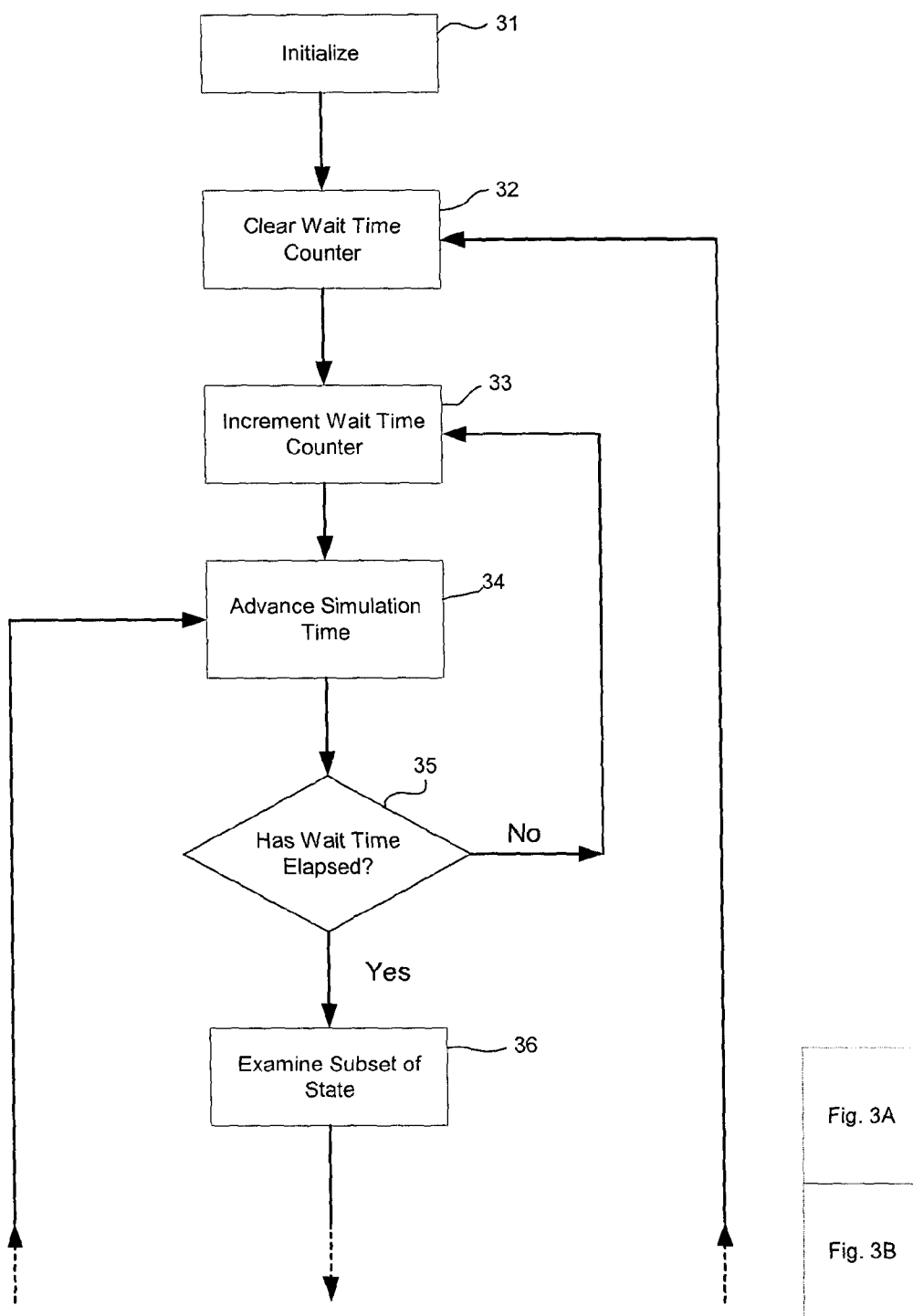
FIGS. 3A and 3B are flow charts which illustrate the operations of one embodiment of the present invention.
Figure 3B:
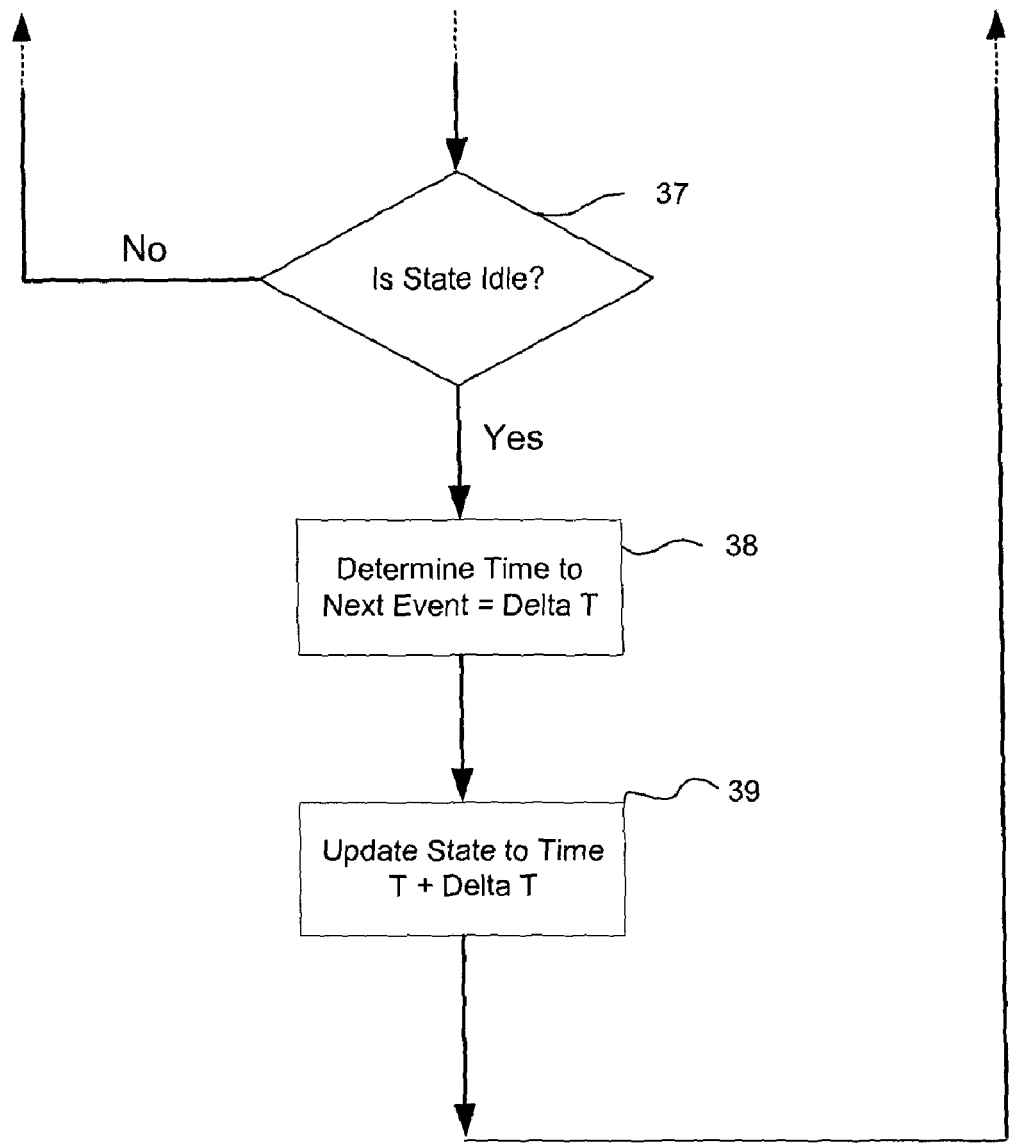

FIGS. 3A and 3B illustrate the operations of the supervisory circuit with the simulated electronic system. First, at the start of the simulation, the state of the system is initialized as shown by step 31. Then in step 32, a Wait Time Counter is cleared to zero to mark the beginning of the wait time, the function of which is described below. The Wait Time Counter is incremented by an amount equal to one simulation step in step 33 and the simulation is advanced by one time step in step 34, and the new state of the system is calculated. The Wait Time Counter is checked in decision step 35. If it has not yet met or exceeded a programmable value, then a time warp evaluation cannot start yet, so the process loops back to increment the wait time counter (step 33) and the simulation is advanced by another time step (step 34). On the other hand, if the counter has met or exceeded the programmable value, then the process proceeds to step 36 in which a predetermined subset of the system state is examined. By evaluation step 37, if each element of the subset meets a specified set of criteria, then the system state is considered to be idle and the process moves to step 38. If, on the other hand, the state is determined to be not idle, then the process loops back to advancing the simulation (step 34). Returning to step 38, the future occurrence of each event in an events list is determined. The event with the minimum time, i.e., the event which will occur soonest, sets the time to the nearest future event (the next event). Delta T is set to this time value, minus one time step. Then in step 39, the simulation is advanced by Delta T; all the elements which determine the state of the electronic system are calculated at current simulation time+Delta T). This advancing can also be performed by advancing a simulation clock by Delta T and so that the simulated electronic system now proceeds at the new simulation time. In any case, the system state has been fast-forwarded, i.e., time-warped, and the process loops back to step 32 for repeated processing.

The wait time managed by the Wait Time Counter and steps 32, 33 and 35 ensure that the simulated electronic system is not simply time-warped forward from idle state to idle state. With wait time, even if the electronic system is in the idle state, some simulation of the electronic system is performed before the simulation clock is advanced for time-warping to provide some assurance that significant simulation is not being missed.

Figure 2:
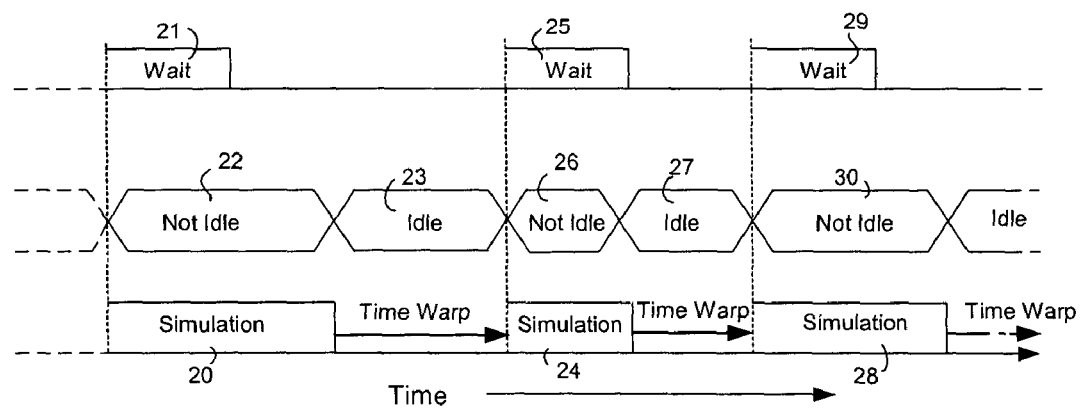
FIG. 2 is a diagram of timing operations of the simulated electronic system with time warping, according to one embodiment of the present invention.

FIG. 2 illustrates the operation of time-warping and the effects of the Wait Time Counter and steps 32, 33 and 35 upon the simulation of an electronic system, in accordance with one embodiment of the present invention. In this example, an arbitrary first simulation interval 20 extends past a first wait time interval 21 because the simulated system state is not idle at the end of the interval 21. When the system state passes into idle state 23, the simulation time is advanced, i.e., time warped, to the next significant event, the beginning of the not idle system state 26. At this point, a second simulation interval 24 is started with a second wait time interval 25. As shown in FIG. 2, the second wait time interval 25 is longer than the not idle state 26 of the system so that simulation continues until the interval of the second wait time 25 ends. Then the simulation is advanced in time past the idle state 27 to the next significant event at the beginning of the not idle state 30. The simulation interval 28 is entered coincidentally with the third wait interval 29, and so on.

The following describes some of the FIGS. 3A and 3B supervisory circuit steps for an electronic system, in this case, an embedded multiprocessor system. The system consists of several independent microprocessors, each running a different software program, together with multiple memory subsystems, input/output interfaces, and inter-processor communication channels. The system is a real-time system, in which data processing tasks must be completed within a specified time interval on a repetitive basis. The exemplary code in C include comments to explain the purpose of the program code. The first description is of simulation step 34 which advances simulation of the electronic system, as described above, coordinates the checking for an idle state (GenerateIdle), determines the time to the next event (FindNextEvent), and adjusts the state during the time warp. It also applies additional logic to determine valid times when time warping can occur.

Below is some exemplary code:

```
GenerateIdle( );
FindNextEvent( );
LOADSIG(RC_CNT);
LOADSIG(LIPP_CNT);
//time warp only when job table is overlay mode.
if    ((State_tw->LIPPCTR!=0xFFE)&&    (State_tw-
>LIPPCTR!=0xFF))
{
SkipTime ( );
// Do this here so that ENABLETIMESTEP has a chance to
be active for a clock
LOADSIG(ENABLE);
if (State tw->ENABLE)
{
LOADSIG(GATEDPSPIDLE);
if (State tw->GATEDPSPIDLE)
{
LOADSIG(NEXTMPSPEVENT);
LOADSIG(ENDPAD);
if (State tw->NEXTMPSPEVENT>State tw->ENDPAD)
{
State_tw->ENABLETIMESTEP=1;
State_tw->MPSPTIMESTEP=State tw->NEXTMPSPE-
VENT–State tw->ENDPAD;
STORESIG(ENABLETIMESTEP);
STORESIG(MPSPTIMESTEP);
}
}
}
}
```

Exemplary code for step 36 is shown below. This step inspects relevant elements, i.e., the subset, of the state of the system, and determines if the "idle" conditions are met. Note that in this example, the subset contains certain variables in memory and processor functions. The C structure element State_tw->PSPIDLE is a flag that is set to "1" if the state is in idle, and "0" otherwise. The first three checks, i.e., the first three "if" conditions, are constant checks and the last check is periodic.

```
static void GenerateIdle( )
{
LOADSIG(MACPC);
LOADSIG(SUBPC);
LOADSIG(IDLE_INTERVAL);
LOADSIG(check_cnt);
```

```
    State_tw->check_cnt--;
    State_tw->PSPIDLE=1;
    if((State_tw->MACPC< 0x1693||State_tw-
>MACPC>0x1695)||(State_tw-
>SUBPC<0x1697||State_tw->SUBPC>0x1699))
      State_tw->PSPIDLE=0;
    if(GetSlot4MainRamValue          (0x40052)
!=0||GetSlot4MainRamValue(0x40053)
!=0||GetSlot4MainRamValue(Ox41EBI)!=0)
      State_tw->PSPIDLE=0;
    if(GetSlot4MainRamValue(0x60052)
!=0||GetSlot4MainRamValue(0x60053)
!=0||GetSlot4MainRamValue(0x62E5D)!=0)
      State_tw->PSPIDLE=0;
    if (State_tw->check_cnt<=0x0)
    {
      State_tw->CountA=GetSlot4MainRamValue
(0x41EAF<<16|GetSlot4MainRamValue(0x41EB0);
      if(State_tw->CountA<=State_tw->LastCountA)
        State_tw->PSPIDLE=0;
      State_tw->CountB=GetSlot4MainRamValue
(0x62E5A<<16|GetSlot4MainRamValue(0x62E5B);
      if(State_tw->CountB<=State_tw->LastCountB)
        State_tw->PSPIDLE=0;
      State_tw->LastCountA=State_tw->CountA;
      State_tw->LastCountB=State_tw->CountB;
      State_tw->check_cnt=State_tw->IDLE_INTERVAL;
    }
    else State_tw->PSPIDLE=0;
    STORESIG(PSPIDLE);
    STORESIG(check_cnt);
  }
```

Step 38 determines the time interval to the next event by inspecting several relevant timers and counters in the system. For each, it determines the time until the counter or timer "times out" or reaches a terminal count. The shortest time period is the time until the next relevant event occurs. State_tw->MPSPTIMESTEP, or delta T in the language of step 38, contains the amount of time, in microseconds, to skip.

```
  static void FindNextEvent( )
  {
    LOADSIG(RCPLICTR);
    LOADSIG(RCPLIPhase);
    LOADSIG(RCPLI_RATE);
    LOADSIG(LIPPCTR);
    LOADSIG(LIPEND);
    LOADSIG(ANTEND);
    LOADSIG(ANTINTCTR);
    LOADSIG(RCATMRA);
    LOADSIG(RCATMRB);
    LOADSIG(RCBTMRA);
    State_tw->RCPLIEvent=(0xFFF-State_tw->RC-
PLICTR)*State_tw->RCPLIPeriod;
    State_tw->LIPPEvent=(State_tw->LIPEND-State_tw-
>LIPPCTR-1)*State_tw->LIPPPeriod;
    State_tw->ANTINTEvent=(State_tw->ANTEND-
State_tw->ANTINTCTR)* State_tw->ANTINTPeriod;
    State_tw->RCATMRAEvent=(0xFFFF-State_tw-
>RCATMRA)*State_tw->RCATMRAPeriod;  State_tw-
>RCBTMRAEvent=(0xFFFF-state_tw->RCBTMRA)
*State_tw->RCBTMRAPeriod;
    State_tw->LIPPEvent+=(State_tw->IPPINIT-
State_tw->IPPCTR)/40;
    State_tw->RCPLIEvent+=(State_tw->RCPLI_RATE-
State_tw->RCPLIPhase)/40;
    State_tw->ANTINTEvent+=(State_tw->RCP-
LI_RATE-State_tw->RCPLIPhase)/40;
    // determine smallest time
    State_tw->NEXTMPSPEVENT=Smaller(State_tw-
>RCPLIEvent, State_tw->LIPPEvent);
    State_tw->NEXTMPSPEVENT=Smaller(State_tw-
>NEXTMPSPEVENT, State_tw->ANTINTEvent);
    State_tw->NEXTMPSPEVENT=Smaller(State_tw-
>NEXTMPSPEVENT, State_tw->RCATMRAEvent);
    State_tw->NEXTMPSPEVENT=Smaller(State_tw-
>NEXTMPSPEVENT, State_tw->RCBTMRAEvent);
    // NEXTMPSPEVENT records the time until the next
event
    STORESIG(NEXTMPSPEVENT);
    STORESIG(RCPLIEvent);
    STORESIG(LIPPEvent);
    STORESIG(ANTINTEvent);
    STORESIG(RCATMRAEvent);
    STORESIG(RCBTMRAEvent);
  }
```

Finally, as explained with respect to FIGS. 3A and 3B, after Delta T is found in step 38, the simulation is advanced in step 39 by Delta T. The code below shows how the step 39 updates the relevant counters and timers in the exemplary system to reflect the amount of time skipped in the time warp. State_tw->MPSPTIMESTEP contains the amount of time, in microseconds, to skip.

```
  static void SkipTime( )
  {
    LOADSIG(ENABLETIMESTEP);
    if(!State_tw->ENABLETIMESTEP)
      return;
    LOADSIG(MPSPTIMESTEP);
    LOADSIG(MASTERTMRA);
    LOADSIG(MASTERTMRB);
    LOADSIG(MASTERTMRBPhase);
    LOADSIG(MASTERTMRC);
    LOADSIG(MASTERTMRD);
    LOADSIG(RCATMRA);
    LOADSIG(RCATMRB);
    LOADSIG(RCATMRBPhase);
    LOADSIG(RCBTMRA);
    LOADSIG(RCBTMRB);
    LOADSIG(RCBTMRBPhase);
    LOADSIG(RCPLICTR);
    LOADSIG(RCPLIPhase);
    LOADSIG(RCPLI_RATE);
    LOADSIG(LIPPCTR);
    LOADSIG(ANTINTCTR);
    LOADSIG(INTRVLCTR);
    LOADSIG(IPPCTR);
    // round off to nearest 10 usec
    State_tw->MPSPTIMESTEP/=10;
    State_tw->MPSPTIMESTEP*=10;
    State_tw->MASTERTMRA+=(word)State_tw->MPSP-
TIMESTEP/10;
    State_tw->MASTERTMRB+=(word)State_tw->MPSP-
TIMESTEP/100;
    State_tw->MASTERTMRC+=(word)State_tw->MPSP-
TIMESTEP;
    State_tw->MASTERTMRD+=(word)State_tw->MPSP-
TIMESTEP;
    // Handle Phase Calc
    State_tw->MASTERTMRBPhase+=((word)State_tw-
>MPSPTIMESTEP/10) % 10;
    if(State_tw->MASTERTMRBPhase>9)
    {
      State_tw->MASTERTMRB++;
      State_tw->MASTERTMRBPhase-=10;
```

```
    }
    State_tw->RCATMRA+=(word)State_tw->MPSP-
TIMESTEP/10;
    State_tw->RCATMRB+=(word)State_tw->MPSP-
TIMESTEP/100;
    // Handle Phase Calc
    State_tw->RCATMRBPhase+=((word)State_tw-
>MPSPTIMESTEP/10) % 10;
    if(State_tw->RCATMRBPhase>9)
    {
    State_tw->RCATMRB++;
    State_tw->RCATMRBPhase-=10;
    }
    State_tw->RCBTMRA+=(word)State_tw->MPSP-
TIMESTEP/10;
    State-tw->RCBTMRB+=(word)State_tw->MPSP-
TIMESTEP/100;
    // Handle Phase Calc
    State_tw->RCBTMRBPhase+=((word)State_tw-
>MPSPTIMESTEP/10) % 10;
    if (State_tw->RCBTMRBPhase>9)
    {
    State_tw->RCBTMRB++;
    State_tw->RCBTMRBPhase-=10;
    }
    State_tw->RCPLICTR+=(word)    (State_tw->MPSP-
TIMESTEP/State_tw->RCPLIPeriod);
    State_tw->LIPPCTR+=(word)    (State_tw->MPSP-
TIMESTEP/State_tw->LIPPPeriod);
    State_tw->ANTINTCTR+=(word)   (State_tw->MPSP-
TIMESTEP/State_tw->ANTINTPeriod);
    // IPPCTR is a 25 ns counter, not a 1 us counter
    State_tw->IPPCTR-=40*((word)    (State_tw->MPSP-
TIMESTEP) % State_tw->LIPpperiod);
    if(State_tw->IPPCTR<=State_tw->IPPEND)
    {
    State_tw->LIPPCTR++;
    State_tw->IPPCTR+=40*State_tw->LIPPPeriod;
    }
    // now do phase for RCPLI & ANTINT (count rate is 40
Mhz, not 1 Mhz)
    State_tw->RCPLIPhase+=(word)    (40*((State_tw-
>MPSPTIMESTEP) % State_tw->RCPLIPeriod));
    if(State_tw->RCPLIPhase>=State_tw->RCPLI_RATE)
    {
    State_tw->RCPLICTR++;
    State_tw->ANTINTCTR++;
    State_tw->RCPLIPhase-=(word)    (State_tw->RCP-
LI_RATE);
    }
    // clear the enabletimestep
    State_tw->ENABLETIMESTEP=0;
    STORESIG(MASTERTMRA);
    STORESIG(MASTERTMRB);
    STORESIG(MASTERTMRBPhase);
    STORESIG(MASTERTMRC);
    STORESIG(MASTERTMRD);
    STORESIG(RCATMRA);
    STORESIG(RCATMRB);
    STORESIG(RCATMRBPhase);
    STORESIG(RCBTMRA);
    STORESIG(RCBTMRB);
    STORESIG(RCBTMRBPhase);
    STORESIG(RCPLICTR);
    STORESIG(LIPPCTR);
    STORESIG(ANTINTCTR);
    STORESIG(IPPCTR);
    STORESIG(RCPLIPhase);
    STORESIG(MPSPTIMESTEP);
    STORESIG(ENABLETIMESTEP);
    }
```

It should be evident that the time-warping is dependent upon the particular simulated electronic system and what the simulator determines to be an idle state. This, in turn, determines the electronic system's subset and the supervisory circuit, an illustrative example of which code is shown above.

Figure 4A:
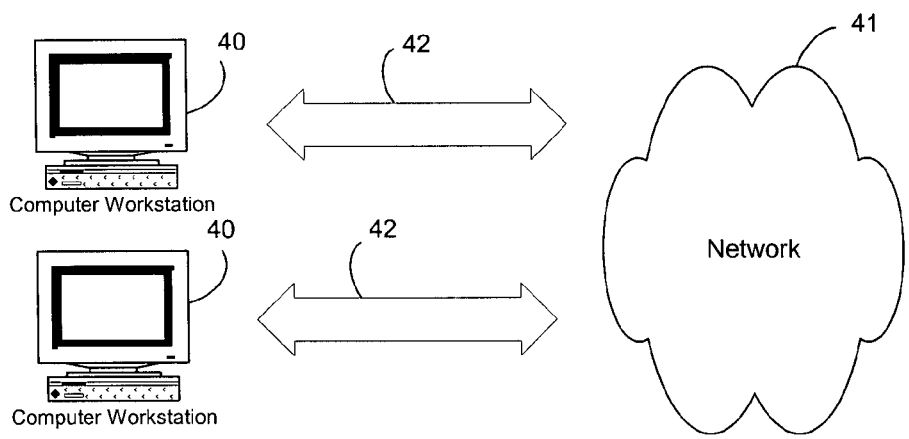
FIG. 4A is a representation of one or more computers which might simulate an electronic system with time warping, according to an embodiment of the present invention.

As mentioned above, the simulation of an electronic system can be carried out by one or more computers. FIG. 4 represents one or more computers 40 which might perform the simulation according to the time warping of the present invention. The computers 40 could be coupled together by backplane bus, or by a network 41 through network interfaces 42.

Figure 4B:
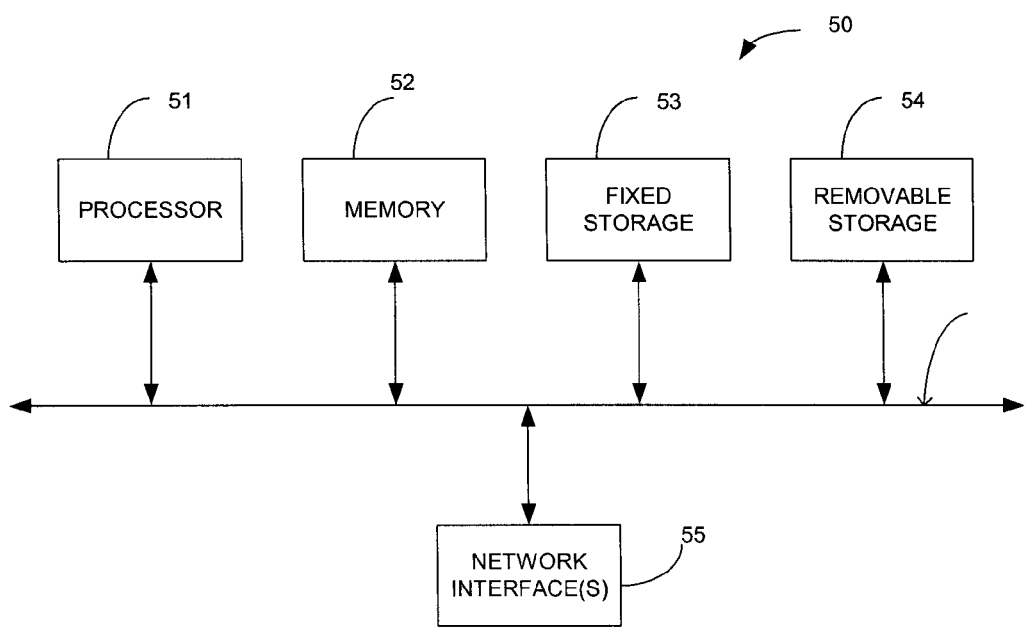
FIG. 4B is a representational block diagram of the FIG. 4A computer(s), according to an embodiment of the present invention.

FIG. 4B shows a block diagram of the representative system 50 of the computer 40 which executes the software of an embodiment of the present invention. The computer system 50 includes memory 52 which can store and retrieve software programs incorporating computer code that implements aspects of the invention, data for use with the invention, and the like. The computer code can be stored in fixed storage memory 53, which could include exemplary computer readable storage media include CD-ROM, floppy disk, tape, flash memory, semiconductor system memory, and hard drives, or retrieved through one or more network interface blocks or cards 55, all connected by a system bus 58. Execution of the computer code is performed by a central processor 51, or more than one processor 51 (i.e., a multi-processor system).

Therefore, while the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. A computer-implemented method for efficiently simulating an electronic system, comprising:
    using a computer to perform steps including:
    determining a state of said simulated electronic system;
    determining the occurrence of a next relevant system event in said simulated electronic system when said simulated electronic system state is determined to be idle;
    advancing a simulation time to immediately prior to said occurrence of said next relevant system event;
    calculating a state of said simulated electronic system at said advanced simulation time so that said state of said simulated electronic system is advanced; and
    further advancing said simulated electronic system by single simulated clock periods until a predetermined wait time has elapsed regardless of whether the simulated electronic system state is idle
    whereby actual time for simulating said electronic system by said computer is reduced.

2. The method of claim 1 further comprising repeating said determining, next relevant system event determining, simulation time advancing, and electronic system state calculating steps.

3. The method of claim 1 wherein said determining step comprises inspecting a predefinable subset of said simulated electronic system.

4. The method of claim 1 further comprising determining next relevant events in said electronic system.

5. The method of claim 1 wherein said further advancing said simulated electronic system by single simulated clock periods step comprises advancing said simulation time of said simulated electronic system by a simulation clock period and calculating said electronic system state at said advanced single simulated clock period.

6. The method of claim 1 wherein said advancing said simulation time step comprises advancing said simulation time by a simulation clock period and calculating said electronic system state at said advanced simulation time when said simulated electronic system is not in an idle state.

7. The method of claim 1 wherein said advancing step comprises advancing a simulation clock and calculating said electronic system state at said advanced simulation clock time when said simulated electronic system is not in an idle state.

8. The method of claim 1 wherein said next relevant system event determining step comprises determining the occurrence of each event on an events list.

9. A computer readable storage medium on which are recorded executable computer code which when executed cause a processor to perform the steps comprising:
  determining a state of a simulated electronic system;
  determining the occurrence of a next relevant system event in said simulated electronic system when said simulated electronic system is determined to be idle;
  advancing a simulation time immediately prior to said occurrence of said next relevant system event;
  calculating a state of said simulated electronic system at said advanced simulation time so that said state of said simulated electronic system is advanced whereby actual time for simulating said electronic system is reduced; and
  further advancing said simulated electronic system by single simulated clock periods until a predetermined wait time has elapsed regardless of whether the simulated electronic system state is idle; whereby actual time for simulating said electronic system is reduced.

10. The computer readable storage medium of claim 9 further comprising repeating said determining, next relevant system event determining, simulation time advancing, and electronic system state calculating code operations.

11. The computer readable storage medium of claim 9 wherein said determining step comprises inspecting a predefinable subset of said simulated electronic system.

12. The computer readable storage medium of claim 9 further comprising determining next relevant events in said electronic system.

13. The computer readable storage medium of claim 9 wherein said further advancing said simulated electronic system by single simulated clock period steps comprises advancing said simulation time of said simulated electronic system by a simulation clock period and calculating said electronic system state at said advanced single simulated clock period.

14. The computer readable storage medium of claim 9 wherein said advancing simulation time step comprises advancing said simulation time by a simulation clock period and calculating said electronic system state at said advanced simulation time when said simulated electronic system is not in an idle state.

15. The computer readable storage medium of claim 9 wherein said advancing simulation time step comprises advancing a simulation clock and calculating said electronic system state at said advanced simulation clock time when said simulated electronic system is not in an idle state.

16. The computer readable storage medium of claim 9 wherein said next relevant system event determining step comprises determining the occurrence of each event on an events list.

* * * * *